(12) United States Patent
Okugawa et al.

(10) Patent No.: US 10,354,904 B2
(45) Date of Patent: Jul. 16, 2019

(54) ELECTROSTATIC CHUCK

(71) Applicant: NGK SPARK PLUG CO., LTD., Nagoya, Aichi (JP)

(72) Inventors: Keisuke Okugawa, Kasugai (JP); Yosuke Shinozaki, Tajima (JP); Toshihisa Nomura, Kasugai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 458 days.

(21) Appl. No.: 14/877,630

(22) Filed: Oct. 7, 2015

(65) Prior Publication Data

US 2016/0126125 A1 May 5, 2016

(30) Foreign Application Priority Data

Oct. 8, 2014 (JP) .................................. 2014-207148

(51) Int. Cl.
*H05B 3/68* (2006.01)
*H01L 21/683* (2006.01)
(Continued)

(52) U.S. Cl.
CPC .... *H01L 21/6833* (2013.01); *H01L 21/67103* (2013.01)

(58) Field of Classification Search
CPC ................... H01L 21/67098–21/67115; H01L 21/683–21/6833
(Continued)

(56) References Cited

U.S. PATENT DOCUMENTS

| 5,543,601 A * | 8/1996 | Bartrug ............. B32B 17/10036 219/203 |
| 6,108,190 A * | 8/2000 | Nagasaki .......... H01L 21/68757 361/234 |

(Continued)

FOREIGN PATENT DOCUMENTS

| JP | S63-283037 A | 11/1988 |
| JP | H08-162518 A | 6/1996 |

(Continued)

OTHER PUBLICATIONS

Korean Industrial Property Office, Office Action (Notification of Provisional Refusal) issued in corresponding Application No. 10-2015-0129907 dated Aug. 24, 2017.

(Continued)

*Primary Examiner* — Sang Y Paik
(74) *Attorney, Agent, or Firm* — Stites & Harbison, PLLC; Jeffrey A. Haeberlin; James R. Hayne

(57) ABSTRACT

An electrostatic chuck includes: a body substrate having a substrate front surface and a substrate rear surface and made of ceramic; an attraction electrode provided in the body substrate; a metal base having a base front surface and a base rear surface, and placed such that the base front surface faces the substrate rear surface of the body substrate; and an internal through hole formed so as to penetrate the base front surface and the base rear surface of the metal base. The body substrate has a plurality of heating regions in each of which a heater electrode is provided. In the internal through hole, a plurality of heater electrode terminals are provided which are electrically connected to the heater electrode in each heating region. The plurality of heater electrode terminals provided in the internal through hole are electrically connected to a connection member provided in the internal through hole.

2 Claims, 6 Drawing Sheets

(51) Int. Cl.
*H01L 21/67* (2006.01)
*H05B 3/08* (2006.01)

(58) Field of Classification Search
USPC .......................... 219/443.1–468.2, 538–548
See application file for complete search history.

(56) References Cited

U.S. PATENT DOCUMENTS

| | | | |
|---|---|---|---|
| 7,189,946 B2* | 3/2007 | Goto | H01L 21/67103 219/444.1 |
| 7,763,831 B2* | 7/2010 | Morioka | H05B 3/143 118/724 |
| 2003/0089600 A1 | 5/2003 | Natsuhara et al. | |
| 2004/0026402 A1* | 2/2004 | Ito | H01L 21/67109 219/444.1 |
| 2004/0175549 A1* | 9/2004 | Ito | B32B 18/00 428/209 |
| 2004/0177812 A1 | 9/2004 | Goto et al. | |
| 2006/0037857 A1 | 2/2006 | Natsuhara et al. | |
| 2006/0221539 A1* | 10/2006 | Morita et al. | 361/234 |
| 2007/0258186 A1 | 11/2007 | Matyushkin et al. | |
| 2012/0285619 A1 | 11/2012 | Matyushkin et al. | |
| 2014/0154819 A1 | 6/2014 | Gaff et al. | |

FOREIGN PATENT DOCUMENTS

| | | |
|---|---|---|
| JP | 2003-160874 A | 6/2003 |
| JP | 2004-171834 A | 6/2004 |
| JP | 2007300057 A | 11/2007 |
| JP | 2007-317772 A | 12/2007 |
| JP | 2008047657 A | 2/2008 |
| JP | 2012-160368 A | 8/2012 |
| JP | 2014-075525 A | 4/2014 |
| JP | 2014165267 A | 9/2014 |
| KR | 10-2008-0046144 A | 5/2008 |
| KR | 10-2010-0001223 A | 1/2010 |
| KR | 20100001223 A | 1/2010 |
| TW | 201438097 A | 10/2014 |

OTHER PUBLICATIONS

Taiwan Intellectual Patent Office, Notification for the Opinion of Examination, issued in corresponding Taiwanese Application No. 104132476, dated Oct. 6, 2016.

The State Intellectual Property Office of China, Notification of First Office Action issued in corresponding Application No. 201510647044.8, dated Sep. 5, 2017.

Japan Patent Office, Office Action (Notification of Reasons for Refusal) issued in corresponding Application No. JP 2014-207148, dated Jul. 3, 2018.

Japan Patent Office, Office Action (Notification of Reasons for Refusal) issued in corresponding Application No. 2014-207148, dated Sep. 25, 2018.

* cited by examiner

ELECTROSTATIC CHUCK

CROSS REFERENCE TO RELATED APPLICATIONS

The present application claims priority to Japanese Patent Application No. 2014-207148, which was filed on Oct. 8, 2014, the disclosure of which is herein incorporated by reference in its entirety.

BACKGROUND OF THE INVENTION

Field of the Invention

The present invention relates to an electrostatic chuck.

Description of Related Art

Conventionally, a semiconductor manufacturing apparatus performs processing such as dry etching (for example, plasma etching) on a semiconductor wafer (for example, silicon wafer). In order to enhance the processing accuracy, support means for reliably supporting the semiconductor wafer in the semiconductor manufacturing apparatus is needed. As the support means, there is known an electrostatic chuck which supports a semiconductor wafer by means of electrostatic attraction force.

If there are variations in the temperature of the semiconductor wafer, the processing accuracy deteriorates. In order to enhance the processing accuracy, it is necessary to uniform the temperature of the semiconductor wafer supported by the electrostatic chuck. For example, Patent Document 1 discloses an electrostatic chuck including a heater electrode inside a ceramic substrate (body substrate) on which the semiconductor wafer is supported. The semiconductor wafer is heated by the heater electrode.

RELATED ART DOCUMENTS

Patent Document 1 is Japanese Patent Application No. 2007-317772.

BRIEF SUMMARY OF THE INVENTION

However, in order to provide a uniform temperature distribution in the semiconductor wafer, the electrostatic chuck in Patent Document 1 has a body substrate divided into a plurality of regions and a heater electrode provided in each region, and is configured such that the temperature of the heater electrode in each region is independently controlled. Therefore, if the number of the heater electrodes increases, the number of heater electrode terminals for feeding power to the heater electrodes also increases. Then, if the number of the heater electrode terminals increases, it is necessary to provide, inside the electrostatic chuck, the same number of internal spaces (terminal holes) for containing the heater electrode terminals, as the number of the heater electrode terminals. Thus, the structure of the electrostatic chuck is complicated.

In addition, for example, if a large number of terminal holes are formed in a metal base for heat dissipation, a part where the terminal holes are formed does not have sufficient contact with the body substrate. Therefore, at the part where the terminal holes are formed, heat dissipation to the metal base reduces, and a large number of thermal singularities (hereinafter, may be referred to as "singularities") at which the temperature locally becomes high are generated on the body substrate. As a result, it becomes difficult to uniform the temperature distribution in the semiconductor wafer. In addition, the formation of a large number of terminal holes in the metal base leads to deterioration in performance of adhesion between the body substrate and the metal base, and further, to deterioration in adhesion workability such as complication of position alignment.

In addition, increase in the number of the heater electrode terminals and the number of the terminal holes leads to deterioration in the degree of design freedom in the internal configuration of the electrostatic chuck, such as the degree of freedom in the position of a cooling channel formed in the metal base, for example. In addition, the number of steps in a manufacturing process of the electrostatic chuck, such as the number of connection steps for connecting a large number of heater electrode terminals to an external power supply or the number of hole forming steps for forming a large number of terminal holes, increases, leading to deterioration in manufacturing efficiency.

The present invention has been made in view of such circumstances, and is to provide an electrostatic chuck which achieves reduction in the number and area of singularities on the body substrate owing to a simplified structure, and achieves facilitation in manufacturing and improvement in manufacturing efficiency owing to decrease in the number of processing steps, etc.

The present invention is an electrostatic chuck including: a body substrate having a substrate front surface and a substrate rear surface and made of ceramic, the body substrate including a plurality of heating regions; a plurality of heater electrodes with a heater electrode provided in each of the plurality of the heating regions of the body substrate; an attraction electrode provided in the body substrate; a metal base having a base front surface and a base rear surface, and placed such that the base front surface faces the substrate rear surface of the body substrate the metal base defining an internal through hole extending from the base rear surface to the base front surface so as to penetrate between the base front surface and the base rear surface of the metal base; and a connection member provided in the internal through hole, the connection member electrically connected to each of the plurality of heater electrode terminals. In other words, the body substrate has a plurality of heating regions in each of which a heater electrode is provided. In the internal through hole, a plurality of heater electrode terminals are provided which are electrically connected to the heater electrode in each heating region. The plurality of heater electrode terminals provided in the internal through hole are electrically connected to a connection member provided in the internal through hole.

In the electrostatic chuck, the plurality of heater electrode terminals electrically connected to the heater electrode in each heating region of the body substrate are collectively provided in the internal through hole. The plurality of heater electrode terminals collectively provided in the internal through hole are electrically connected to the connection member provided in the internal through hole.

Therefore, it becomes unnecessary to provide the same number of terminal holes (corresponding to the internal through hole of the present invention) as the number of the heater electrode terminals in the electrostatic chuck as in the conventional case. Thus, the structure of the electrostatic chuck can be simplified, and the number and area of singularities on the body substrate can be reduced. Therefore, it is possible to better uniform the temperature distribution in an attraction subject such as a semiconductor wafer attracted by the attraction electrode provided in the body substrate.

Since it is not necessary to provide a large number of terminal holes inside the electrostatic chuck as in the conventional case, the degree of design freedom in the internal configuration of the electrostatic chuck can be enhanced. In the case where the body substrate and the metal base are adhered via, for example, the adhesion layer or the like, performance of the adhesion therebetween can be improved, and further, adhesion workability such as position alignment can also be improved. As compared to the conventional case, the number of steps (for example, the number of hole forming steps) in the manufacturing process can be reduced, the manufacturing can be facilitated, and the manufacturing efficiency can be improved.

Since the plurality of heater electrode terminals are connected to one connection member in the internal through hole, work for electric connection between the heater electrode terminals and an external member can be efficiently performed. Thus, the manufacturing can be facilitated and the manufacturing efficiency can be improved. For example, if the plurality of heater electrode terminals can be collectively connected to one connection member, the number of connection steps can be reduced, and the manufacturing efficiency can be further enhanced.

Thus, according to the present invention, it is possible to provide the electrostatic chuck which achieves reduction in the number and area of singularities on the body substrate owing to a simplified structure, and achieves facilitation in manufacturing and improvement in manufacturing efficiency owing to decrease in the number of processing steps, etc.

In the electrostatic chuck, as seen from the substrate front surface of the body substrate toward the substrate rear surface of the body substrate, the internal through hole may be located in one of the plurality of heating regions of the body substrate. In this case, the position of the internal through hole which can cause a singularity can be located at a position corresponding to a specific heating region. As a result, by controlling the heater electrode in the specific heating region to perform temperature adjustment, the temperature distribution in the attraction subject can be more easily adjusted and kept uniform.

The metal base of the electrostatic chuck may further define a terminal through hole extending from the base rear surface to the base front surface so as to penetrate the base front surface and the base rear surface, and with an attraction electrode terminal provided in the terminal through hole, the attraction electrode terminal electrically connected to the attraction electrode provided in the body substrate. In addition, as seen from the substrate front surface of the body substrate toward the substrate rear surface of the body substrate, the terminal through hole and the internal through hole may be located in the same heating region. In this case, the positions of the internal through hole and the terminal through hole which can cause singularities can be located at positions corresponding to the same specific heating region. As a result, by controlling the heater electrode in the specific heating region to perform temperature adjustment, the temperature distribution in the attraction subject can be more easily adjusted and kept uniform.

Each heater electrode terminal may have a male connection portion having a projecting shape, and the connection member may have a plurality of female connection portions having a recess shape, with each of the female connection portions configured to connect to the male connection portion of each of the plurality of heater electrode terminals. In this case, work for connecting the plurality of heater electrode terminals to one connection member in the internal through hole is facilitated. In addition, reliability in electric connection between the heater electrode terminals and the connection member can be enhanced.

The body substrate is configured to be able to attract the attraction subject by using an electrostatic attraction force occurring when voltage is applied to the attraction electrode provided in the body substrate. Examples of the attraction subject include a semiconductor wafer and a glass substrate.

The body substrate can be formed by a plurality of ceramic layers that are stacked, for example. Such a configuration facilitates formation of various structures (for example, heater electrode) inside the body substrate.

As the ceramic material for the body substrate, a sintered body containing, as a major component, high temperature fired ceramic made of alumina, yttria (yttrium oxide), aluminum nitride, boron nitride, silicon carbide, silicon nitride, or the like can be used, for example.

As the ceramic material for the body substrate, depending on purposes, a sintered body containing, as a major component, low temperature fired ceramic such as glass ceramic obtained by adding an inorganic ceramic filler such as alumina to borosilicate-based glass or lead borosilicate-based glass, may be used. Alternatively, a sintered body containing, as a major component, dielectric ceramic made of barium titanate, lead titanate, strontium titanate, or the like may be used.

In processes such as dry etching for manufacturing a semiconductor, various techniques using plasma are employed. In a process using plasma, corrosive gas such as halogen gas is often used. Therefore, the electrostatic chuck exposed to plasma or corrosive gas requires a high corrosion resistance. Therefore, it is preferable that the body substrate is made of ceramic material having corrosion resistance against plasma and corrosive gas, e.g., ceramic material containing alumina, yttria, or the like as a major component.

The materials for conductors forming the attraction electrode and the heater electrodes are not particularly limited. However, in the case where these conductors and ceramic part (body substrate) are formed by a co-firing method, metal powder in the conductors needs to have a higher melting point than the firing temperature for the body substrate. For example, in the case where the body substrate is made of so-called high temperature fired ceramic (for example, alumina), as the metal powder in the conductors, nickel (Ni), tungsten (W), molybdenum (Mo), manganese (Mn), an alloy thereof, or the like can be used.

In the case where the body substrate is made of so-called low temperature fired ceramic (for example, glass-ceramic), as the metal powder in the conductors, copper (Cu), silver (Ag), or an alloy thereof can be used. In the case where the body substrate is made of high dielectric constant ceramic (for example, barium titanate), as the metal powder in the conductors, nickel (Ni), copper (Cu), silver (Ag), palladium (Pd), platinum (Pt), an alloy thereof, or the like can be used.

The attraction electrode and the heater electrodes can be formed by, using a conductive paste containing metal powder, applying the conductor paste by a conventional known method, e.g., screen printing, and then sintering the conductor paste.

As the metal material for the metal base, copper (Cu), aluminum (Al), iron (Fe), titanium (Ti), or the like can be used.

The body substrate and the metal base are joined (adhered) via an adhesion layer or the like provided therebetween. As the material forming the adhesion layer, for example, resin material such as silicone resin, acrylic resin, epoxy resin, polyimide resin, polyamide-imide resin, or polyamide resin, or a metal material such as indium can be used.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
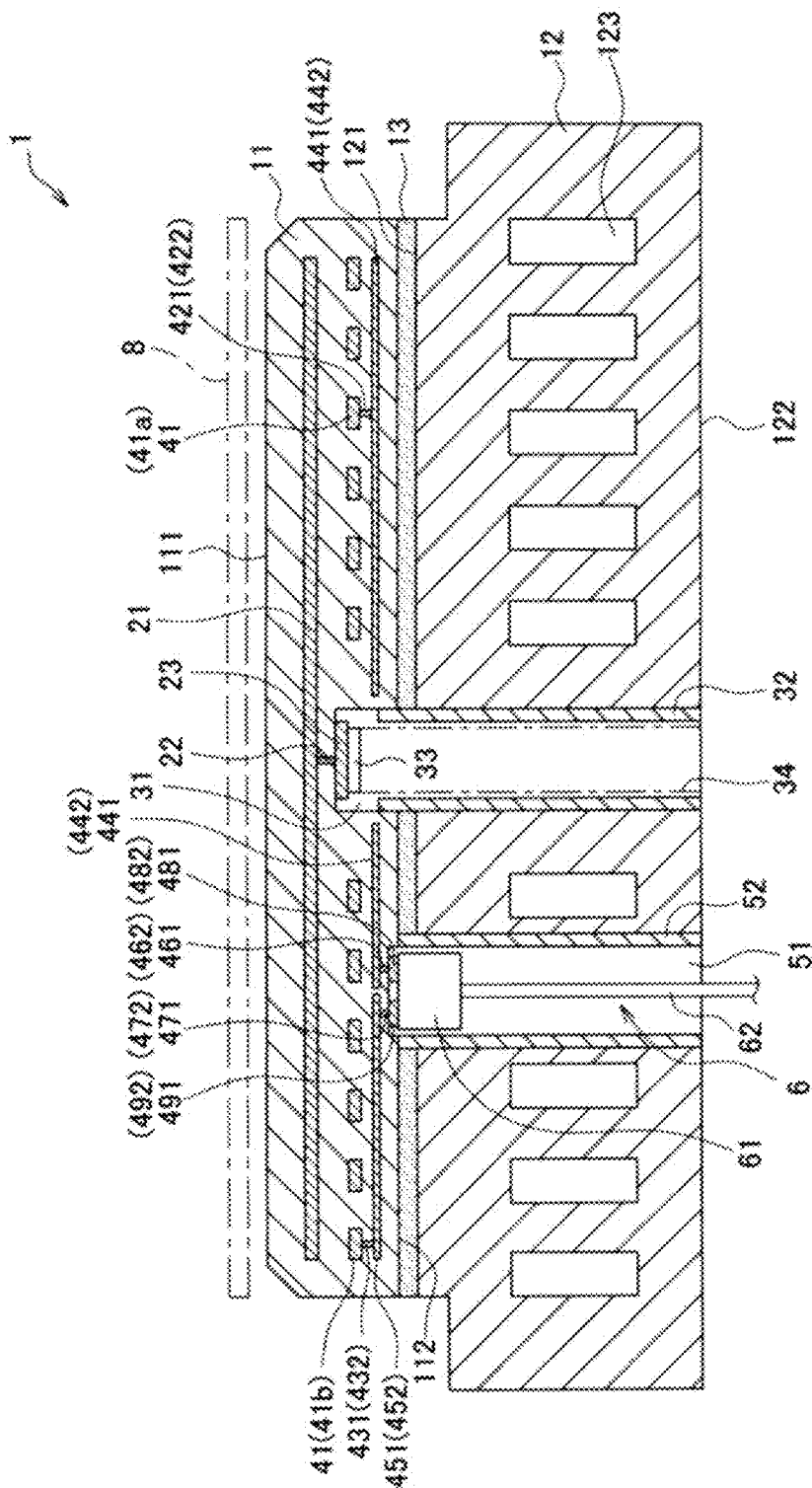
FIG. 1 is a cross section explanation view showing the structure of an electrostatic chuck of embodiment 1.

Hereinafter, embodiments of the present invention will be described with reference to the drawings.

A. First Embodiment

As shown in FIGS. 1 to 5, an electrostatic chuck 1 of the present embodiment includes: a body substrate 11 having a substrate front surface 111 and a substrate rear surface 112, and made of ceramic; an attraction electrode 21 provided in the body substrate 11; a metal base 12 having a base front surface 121 and a base rear surface 122 and placed such that the base front surface 121 faces the substrate rear surface 112 of the body substrate 11 (i.e., the substrate rear surface side of the body substrate); and an internal through hole 51 formed so as to penetrate between the base front surface 121 and the base rear surface 122 of the metal base 12 (i.e., the metal base 12 defines an internal through hole 51 extending from the base rear surface 122 to the base front surface 121).

The body substrate 11 has a plurality of heating regions 113 (113a, 113b) in which heater electrodes 41 (41a, 41b) are respectively provided. In the internal through hole 51, a plurality of heater electrode terminals 53 are provided which are electrically connected to the heater electrodes 41 (41a, 41b) in the heating regions 113 (113a, 113b). The plurality of heater electrode terminals 53 provided in the internal through hole 51 are electrically connected to a connection member 6 provided in the internal through hole 51. Hereinafter, the electrostatic chuck 1 will be described in detail.

As shown in FIG. 1, the electrostatic chuck 1 is a device for attracting and holding the semiconductor wafer 8 which is an attraction subject. The electrostatic chuck 1 includes the body substrate 11, the metal base 12, an adhesion layer 13, and the like. The body substrate 11 and the metal base 12 are joined via the adhesion layer 13 provided therebetween.

In the present embodiment, the body substrate 11 side is defined as an upper side, and the metal base 12 side is defined as a lower side. An up-down direction is a stacking direction of the body substrate 11 and the metal base 12, and is a thickness direction of the body substrate 11 and the metal base 12. A direction perpendicular to the up-down direction (thickness direction) is a direction (a planar direction, a plane direction) in which the electrostatic chuck 1 spreads in a plane.

As shown in FIG. 1, the body substrate 11 is a member for attracting and holding the semiconductor wafer 8. The body substrate 11 has the substrate front surface 111 and the substrate rear surface 112, and is formed in a disk shape with a diameter of 300 mm and a thickness of 3 mm. The substrate front surface 111 of the body substrate 11 is an attraction surface which attracts the semiconductor wafer 8. The body substrate 11 is formed by stacking a plurality of ceramic layers (not shown). Each ceramic layer is made of an alumina sintered body containing alumina as a major component.

Inside the body substrate 11, the attraction electrode 21 and the heater electrodes (heat generating bodies) 41 are provided. The attraction electrode 21 is placed on substantially the same plane inside the body substrate 11. The attraction electrode 21 generates an electrostatic attraction force by DC high voltage being applied thereto. By the electrostatic attraction force, the semiconductor wafer 8 is attracted and held on the substrate front surface (attraction surface) 111 of the body substrate 11. The attraction electrode 21 is made of tungsten.

The heater electrodes 41 are provided on the lower side (metal base 12 side) relative to the attraction electrode 21, inside the body substrate 11. The heater electrodes 41 are placed on substantially the same plane inside the body substrate 11. The heater electrodes 41 are made of tungsten. As the materials of the attraction electrode 21 and the heater electrodes 41, instead of the aforementioned tungsten, molybdenum or an alloy thereof may be used.

As shown in FIG. 1, the metal base 12 is a metallic cooling member (cooling plate) made of aluminum or an aluminum alloy. The metal base 12 has the base front surface 121 and the base rear surface 122, and is formed in a disk shape with a diameter of 340 mm and a thickness of 32 mm. The metal base 12 is provided on the lower side of the body substrate 11. Inside the metal base 12, a refrigerant flow path 123 is provided through which a cooling medium (for example, fluorinated liquid, pure water, etc.) flows.

As shown in FIG. 1, the adhesion layer 13 is provided between the body substrate 11 and the metal base 12. The adhesion layer 13 is formed by an adhesive agent made of silicone resin. The body substrate 11 and the metal base 12 are joined via the adhesion layer 13.

Figure 2A:
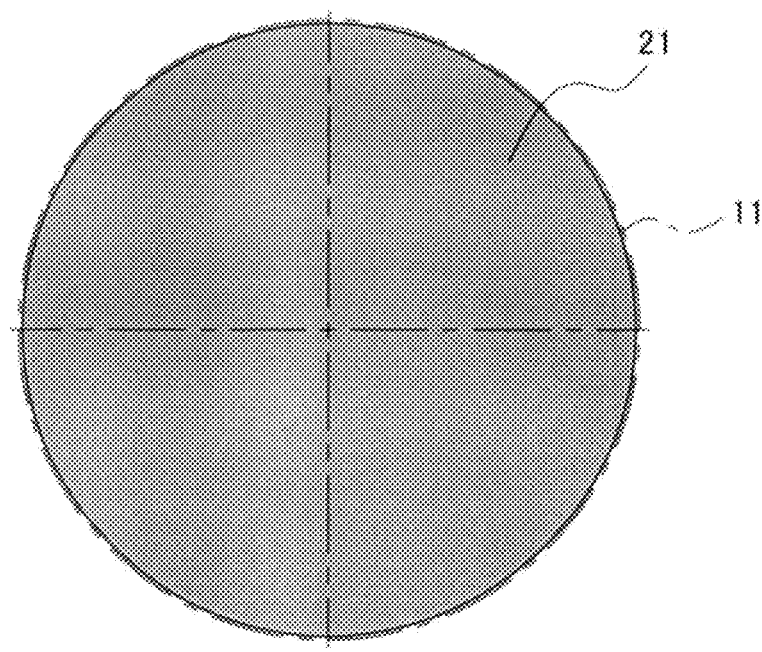
FIG. 2(A) is a plan view showing an attraction electrode.

As shown in FIG. 2(A), the attraction electrode 21 is placed on substantially the same plane inside the body substrate 11, as described above. The attraction electrode 21 is formed in a circular shape in a plan view.

Figure 2B:
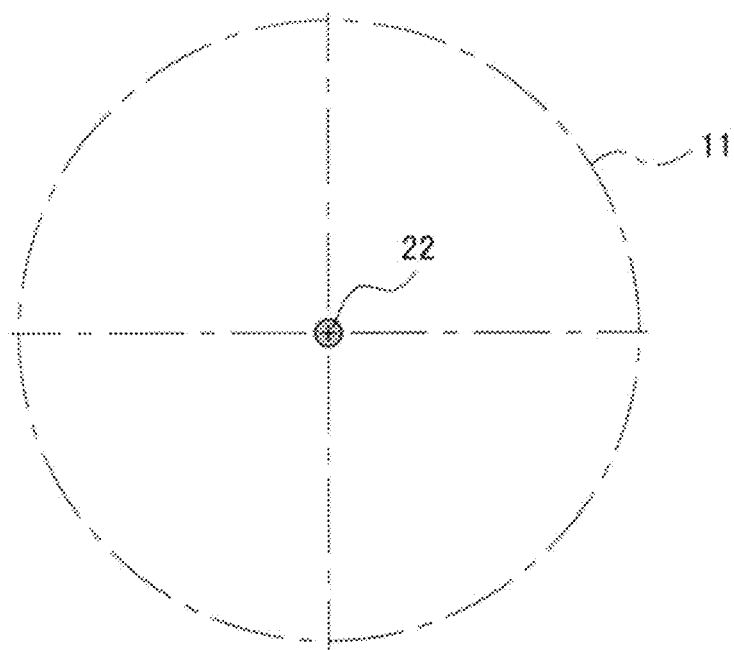
FIG. 2(B) is a plan view showing a via connected to the attraction electrode.

As shown in FIG. 2(B), a via 22 is provided on the lower side (metal base 12 side) of the attraction electrode 21. The via 22 is formed in the up-down direction along the central axis of the body substrate 11. The via 22 is connected to the attraction electrode 21.

As shown in FIG. 1, inside the electrostatic chuck 1, a terminal through hole 31 having a circular sectional shape is formed along the up-down direction from the base rear surface 122 of the metal base 12 to the body substrate 11 side. The terminal through hole 31 penetrates between the base rear surface 122 and the base front surface 121 of the metal base 12, to reach the inside of the body substrate 11. The terminal through hole 31 is provided at a position different from a position where the internal through hole 51 described later is formed. A cylindrical insulating member 32 is fitted into the terminal through hole 31. On a bottom surface (body substrate 11) of the terminal through hole 31, a metalized layer 23 is provided. The metalized layer 23 is electrically connected to the via 22. That is, the attraction electrode 21 is connected to the metalized layer 23 by the via 22.

On the metalized layer 23, an attraction electrode terminal 33 is provided. A terminal metal fitting 34 is attached to the attraction electrode terminal 33. The terminal metal fitting 34 is connected to a power supply circuit (not shown). The attraction electrode 21 is supplied with power for generating an electrostatic attraction force, via the attraction electrode terminal 33 and the like.

Figure 3A:
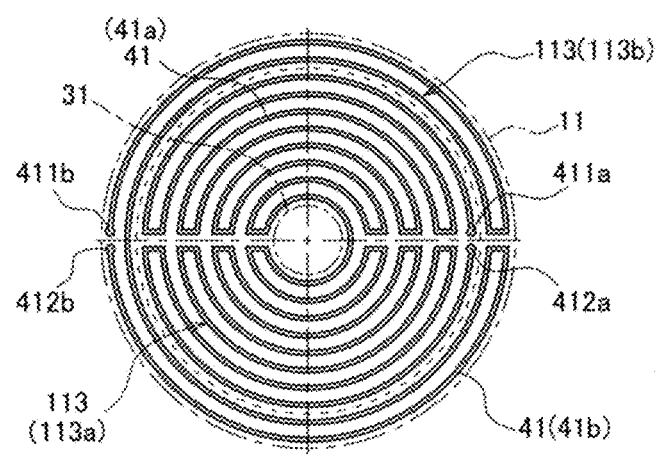
FIG. 3(A) is a plan view showing heater electrodes.

As shown in FIG. 3(A), the body substrate 11 has two heating regions 113. That is, the body substrate 11 has a first heating region 113a which is an inner side region including the central axis of the body substrate 11, and a second heating region 113b which is a region outside the first heating region 113a.

The heater electrodes 41 are placed on substantially the same plane inside the body substrate 11, as described above. The heater electrodes 41 include a first heater electrode 41a provided in the first heating region 113a, and a second heater electrode 41b provided in the second heating region 113b. The first heater electrode 41a and the second heater electrode 41b, which are long-sized, are substantially concentrically arranged while being folded back a plurality of times, in the first heating region 113a and the second heating region 113b, respectively.

Figure 3B:
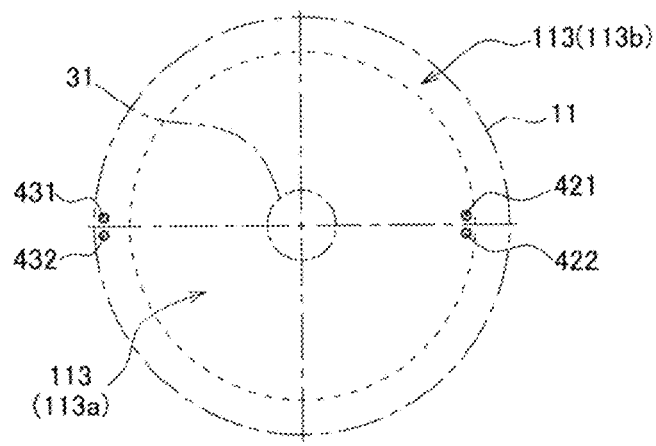
FIG. 3(B) is a plan view showing vias connected to the heater electrode.

As shown in FIG. 3(B), in the first heating region 113a, a pair of vias 421 and 422 are provided on the lower side (metal base 12 side) of the first heater electrode 41a. The vias 421 and 422 are respectively connected to a pair of terminal portions 411a and 412a of the first heater electrode 41a.

In the second heating region 113b, a pair of vias 431 and 432 are provided on the lower side (metal base 12 side) of the second heater electrode 41b. The vias 431 and 432 are respectively connected to a pair of terminal portions 411b and 412b of the second heater electrode 41b.

As shown in FIG. 1, on the lower side (metal base 12 side) of the pair of vias 421 and 422 and the pair of vias 431 and 432, four drivers (internal conductive layers) 441, 442, 451, and 452 (in FIG. 1, only the drivers 441 and 451 are shown) are provided which are formed separately from each other. The drivers 441, 442, 451, and 452 are placed on substantially the same plane inside the body substrate 11. A pair of the drivers 441 and 442 are connected to the pair of vias 421 and 422, respectively. A pair of drivers 451 and 452 are connected to the pair of vias 431 and 432, respectively.

Figure 3C:
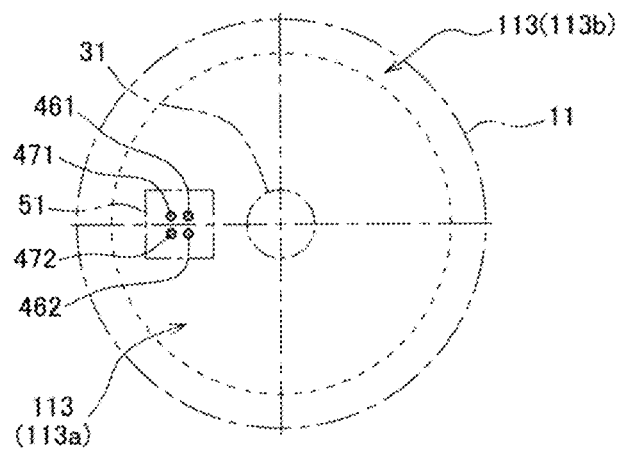
FIG. 3(C) is a plan view showing vias connected to a driver.

As shown in FIG. 3(C), on the lower side (metal base 12 side) of the pair of drivers 441 and 442, a pair of vias 461 and 462 are provided. The pair of vias 461 and 462 are connected to the pair of drivers 441 and 442, respectively.

On the lower side (metal base 12 side) of the pair of drivers 451 and 452, a pair of vias 471 and 472 are provided.

The pair of vias 471 and 472 are connected to the pair of drivers 451 and 452, respectively.

As shown in FIG. 1, inside the electrostatic chuck 1, the internal through hole 51 having a rectangular sectional shape is formed along the up-down direction from the base rear surface 122 of the metal base 12 to the body substrate 11 side. The internal through hole 51 penetrates between the base rear surface 122 and the base front surface 121 of the metal base 12, to reach the inside of the body substrate 11. A cylindrical insulating member 52 is fitted into the internal through hole 51.

On a bottom surface (body substrate 11) of the internal through hole 51, four metalized layers 481, 482, 491, and 492 (in FIG. 1, only the metalized layers 481 and 491 are shown) are provided. A pair of the metalized layers 481 and 482 are connected to the pair of vias 461 and 462, respectively. A pair of the metalized layers 491 and 492 are connected to the pair of vias 471 and 472, respectively.

Figure 4A:
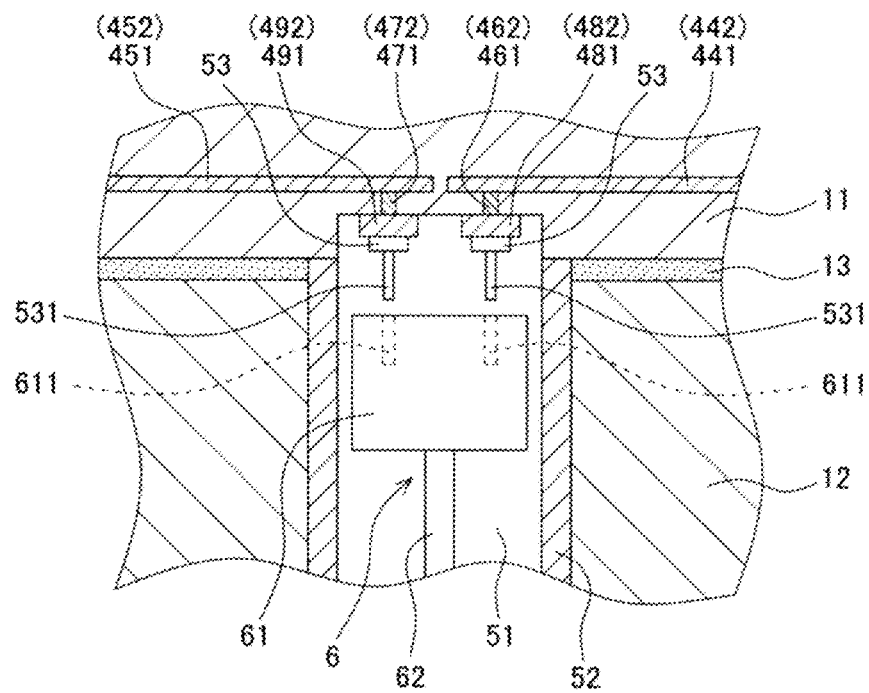
FIG. 4(A) is an explanation view showing the structures of heater electrode terminals and a connection member.

As shown in FIG. 4(A), the heater electrode terminals 53 are provided on the respective metalized layers 481, 482, 491, and 492. The heater electrode terminals 53 are joined to the respective metalized layers 481, 482, 491, and 492 by means of brazing. That is, of the four heater electrode terminals 53, two heater electrode terminals 53 are electrically connected to the first heater electrode 41a, and the other two heater electrode terminals 53 are electrically connected to the second heater electrode 41b. Each heater electrode terminal 53 has a male connection portion 531 having a projecting shape (pin shape). The pin diameter of the male connection portion 531 may be 0.2 to 0.5 mm, the pin length may be 2 to 5 mm, and the placement pitch may be 1 to 2.54 mm.

In the internal through hole 51, one connection member 6 is provided. The connection member 6 has a connector portion 61 and a connection cable 62. The connector portion 61 has four female connection portions 611 having a recess shape corresponding to the male connection portions 531 having a projecting shape (pin shape).

Figure 4B:
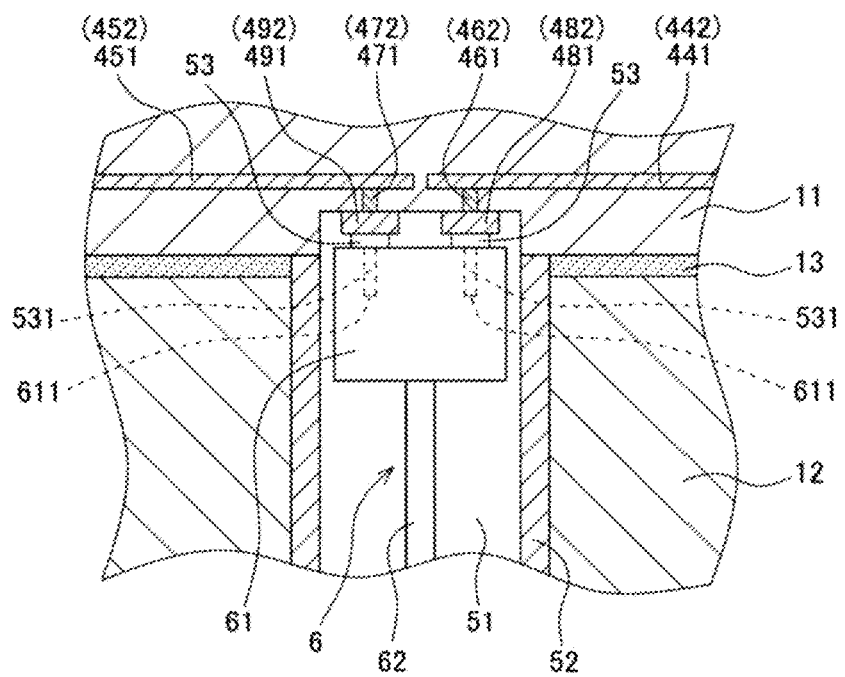
FIG. 4(B) is an explanation view showing a state in which the heater electrode terminals and the connection member are electrically connected.

As shown in FIG. 4(B), the male connection portions 531 of the heater electrode terminals 53 are inserted into the female connection portions 611 of the connector portion 61 of the connection member 6. The four heater electrode terminals 53 are electrically connected to one connection member 6. The connection member 6 is connected to a power supply circuit (not shown). The first heater electrode 41a and the second heater electrode 41b are supplied with power for causing the first heater electrode 41a and the second heater electrode 41b to generate heat, via the heater electrode terminals 53, the connection member 6, and the like.

Figure 5:
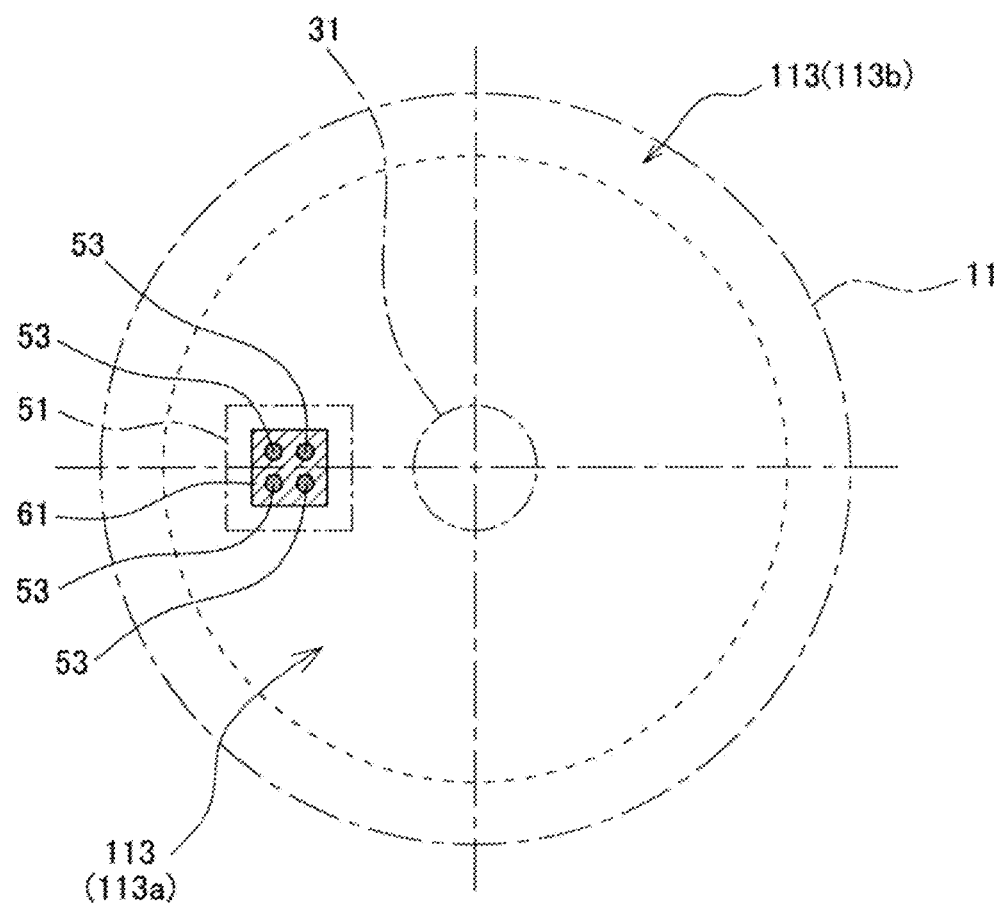
FIG. 5 is an explanation view showing the positions of a terminal through hole and an internal through hole.

As shown in FIG. 5, the entirety of the internal through hole 51 is located at a position corresponding to the first heating region 113a of the body substrate 11. The entirety of the terminal through hole 31 is also located at a position corresponding to the first heating region 113a, as in the internal through hole 51.

As described above, in the internal through hole 51, the four heater electrode terminals 53 which are electrically connected to the first heater electrode 41a and the second heater electrode 41b are provided. The four heater electrode terminals 53 provided in the internal through hole 51 are electrically connected to one connection member 6 provided in the internal through hole 51.

Although not shown, inside the electrostatic chuck 1 (the body substrate 11, the metal base 12, and the adhesion layer 13), a cooling gas supply path is provided which serves as a passage for supplying a cooling gas such as helium for cooling the semiconductor wafer 8. In the substrate front surface (attraction surface) 111 of the body substrate 11, a plurality of cooling openings (not shown) at which the cooling gas supply path opens, and an annular cooling groove (not shown) formed so as to allow the cooling gas supplied from the cooling openings to spread over the entire substrate front surface (attraction surface) 111 of the body substrate 11, are provided.

Next, a manufacturing method for the electrostatic chuck 1 will be described.

First, by a conventional known method, a ceramic green sheet containing alumina as a major component is formed. In the present embodiment, a plurality of such ceramic green sheets to become the body substrate 11 are formed.

Next, in the plurality of ceramic green sheets, a space to become the terminal through hole 31, a space to become a flow path for a cooling gas, such as a cooling gas supply path, through holes to become the vias 22, 421, 422, 431, 432, 461, 462, 471, and 472, and the like are formed at required locations. The terminal through hole 31 is to be finally subjected to a polishing process in order to achieve a higher positional accuracy.

Next, in the plurality of ceramic green sheets, the through holes formed at positions corresponding to the vias 22, 421, 422, 431, 432, 461, 462, 471, and 472 are filled with metalizing ink. In addition, on the plurality of ceramic green sheets, metalizing ink is applied to positions where the attraction electrode 21, the heater electrodes 41 (41a, 41b), the drivers 441, 442, 451, and 452 are to be formed, by means of screen printing or the like. The metalizing ink is obtained by mixing tungsten powder with material powder for the ceramic green sheet containing alumina as a major component, into a slurry state.

Next, the plurality of ceramic green sheets are stacked with their positions aligned with each other, and then bonded by thermocompression. Thus, stacked sheets are obtained. Then, the stacked sheets are cut into a predetermined shape. Thereafter, in the reducing atmosphere, the stacked sheets are fired for five hours under the temperature condition in a range of 1400 to 1600° C. (for example, 1450° C.). Thus, the body substrate 11 formed by an alumina sintered body is obtained.

Next, the metalized layers 23, 481, 482, 491, and 492, and the like are formed at required locations in the body substrate 11. Then, the attraction electrode terminal 33 is provided on the metalized layer 23. In addition, the heater electrode terminals 53 are joined to the metalized layers 481, 482, 491, and 492 by brazing. In the present embodiment, the four heater electrode terminals 53 are collectively joined to the metalized layers 481, 482, 491, and 492 by brazing.

Thereafter, the body substrate 11 and the metal base 12 are joined using an adhesive agent made of silicone resin. In the metal base 12, spaces to become the terminal through hole 31 and the internal through hole 51 are formed at required locations in advance. Thus, the body substrate 11 and the metal base 12 are joined by the adhesion layer 13.

Next, the connection member 6 is inserted into the internal through hole 51. Then, the male connection portions 531 of the four heater electrode terminals 53 are plugged and inserted into the female connection portions 611 of the connector portion 61 of the connection member 6. Thus, the heater electrode terminals 53 and the connection member 6 are connected. Thus, the electrostatic chuck 1 is obtained.

Next, operation and effect of the electrostatic chuck 1 of the present embodiment will be described.

In the electrostatic chuck 1 of the present embodiment, a plurality of (four) heater electrode terminals 53 electrically connected to the heater electrodes 41a and 41b in the heating regions 113a and 113b of the body substrate 11 are collectively provided in the internal through hole 51. The plurality of (four) heater electrode terminals 53 collectively provided in the internal through hole 51 are electrically connected to the connection member 6 provided in the internal through hole 51.

Therefore, it becomes unnecessary to provide the same number of terminal holes (corresponding to the internal through hole 51 in the present embodiment) as the number of the heater electrode terminals 53 in the electrostatic chuck 1 as in the conventional case. Thus, the structure of the electrostatic chuck 1 can be simplified, and the number and area of singularities on the body substrate 11 can be reduced. Therefore, it is possible to better provide a uniform temperature distribution in the semiconductor wafer (attraction subject) 8 attracted by the attraction electrode 21 provided in the body substrate 11.

Since it is not necessary to provide a large number of terminal holes inside the electrostatic chuck 1 as in the conventional case, the degree of design freedom in the internal configuration of the electrostatic chuck 1 can be enhanced. In the case where the body substrate 11 and the metal base 12 are adhered via the adhesion layer 13 as in the present embodiment, performance of the adhesion therebetween can be improved, and further, adhesion workability such as position alignment can also be improved. As compared to the conventional case, the number of steps (for example, the number of hole forming steps) in the manufacturing process can be reduced, the manufacturing can be facilitated, and the manufacturing efficiency can be improved.

Since the plurality of heater electrode terminals 53 are connected to one connection member 6 in the internal through hole 51, work for electric connection between the heater electrode terminals 53 and an external member (connection member 6) can be efficiently performed. Thus, the manufacturing can be facilitated and the manufacturing efficiency can be improved. As in the present embodiment, if the plurality of heater electrode terminals 53 are collectively connected to one connection member 6, the number of connection steps can be reduced, and the manufacturing efficiency can be further enhanced.

In the electrostatic chuck 1 of the present embodiment, as seen from the substrate front surface 111 side of the body substrate 11 toward the substrate rear surface 112 thereof, the internal through hole 51 is located in one of the heating regions 113 (in the present embodiment, the first heating region 113a) of the body substrate 11. Therefore, the position of the internal through hole 51 which can cause a singularity can be located at a position corresponding to a specific heating region 113 (first heating region 113a). As a result, by controlling the heater electrode 41 (first heater electrode 41a) in the specific heating region 113 (first heating region 113a) to perform temperature adjustment, the temperature distribution in the semiconductor wafer (attraction subject) 8 can be more easily adjusted and uniformed.

The electrostatic chuck 1 further includes the terminal through hole 31 which is formed so as to penetrate the base front surface 121 and the base rear surface 122 of the metal base 12 and in which the attraction electrode terminal 33 electrically connected to the attraction electrode 21 is provided. In other words, the metal base 12 further defines the terminal through hole 31 extending from the base rear surface 122 to the base front surface 121 so as to penetrate the base front surface 121 and the base rear surface 122, and the attraction electrode terminal 33 is provided in the terminal through hole 31 with the attraction electrode terminal 33 electrically connected to the attraction electrode 21 provided in the body substrate 11. In addition, as seen from the substrate front surface 111 side of the body substrate 11 toward the substrate rear surface 112 thereof, the terminal through hole 31 is located in the same heating region 113 (113a) as the internal through hole 51 is. Therefore, the positions of the internal through hole 51 and the terminal through hole 31 which can cause singularities can be located at positions corresponding to the same specific heating region 113 (first heating region 113a). As a result, by controlling the heater electrode 41 (first heater electrode 41a) in the specific heating region 113 (first heating region 113a) to perform temperature adjustment, the temperature distribution in the semiconductor wafer (attraction subject) 8 can be more easily adjusted and uniformed.

On the heater electrode terminals 53, the male connection portions 531 having a projecting shape (pin shape) are provided. In addition, the connection member 6 has a plurality of female connection portions 611 having a recess shape, which are to be connected to the male connection portions 531 of the heater electrode terminal 53. Therefore, work for connecting the plurality of heater electrode terminals 53 to one connection member 6 in the internal through hole 51 is facilitated. In addition, reliability in electric connection between the heater electrode terminals 53 and the connection member 6 can be enhanced.

Thus, according to the present embodiment, it is possible to provide the electrostatic chuck 1 which achieves reduction in the number and area of singularities on the body substrate owing to a simplified structure, and achieves facilitation in manufacturing and improvement in manufacturing efficiency owing to decrease in the number of processing steps, etc.

B. Second Embodiment

Figure 6A:
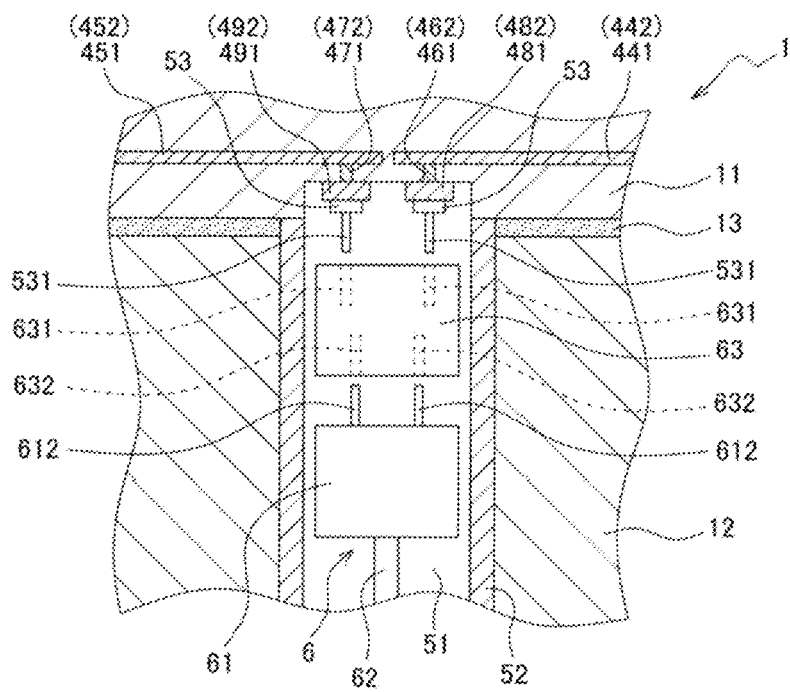
FIG. 6(A) is an explanation view showing the structures of heater electrode terminals and a connection member in an electrostatic chuck of embodiment 2.
Figure 6B:
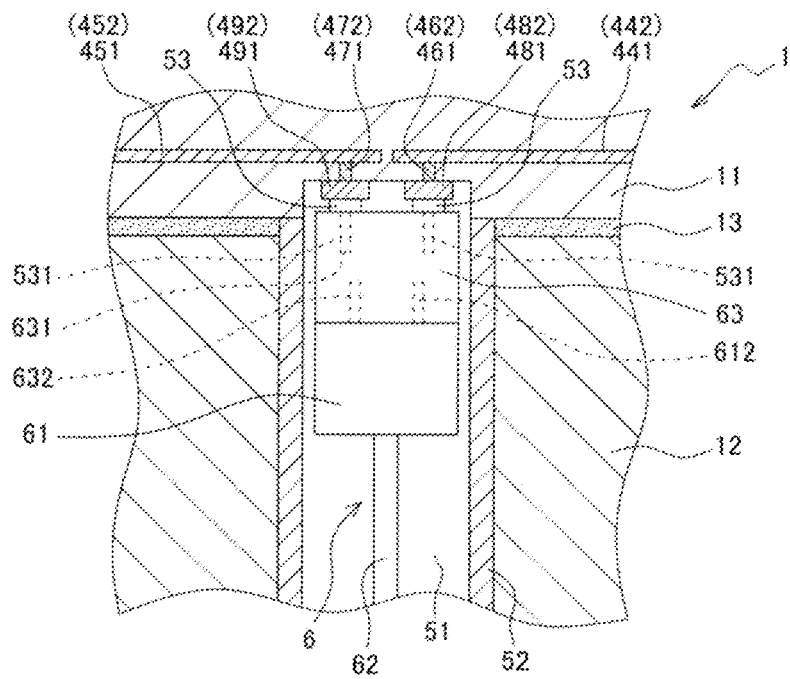
FIG. 6(B) is an explanation view showing a state in which the heater electrode terminals and the connection member are electrically connected.

The present embodiment is an example in which the configuration of the connection member 6 is modified in the electrostatic chuck 1 as shown in FIGS. 6(A) and 6(B).

As shown in FIG. 6(A), the connection member 6 has a connector portion 61, a connection cable 62, and a relay member 63. The connector portion 61 has four connection projections 612 having a projecting shape (pin shape). The relay member 63 has four female connection portions 631 having a recess shape, to which the male connection portions 531 of the heater electrode terminals 53 are connected. In addition, the relay member 63 has four connection recesses 632 having a recess shape, to which the connection projections 612 of the connector portion 61 are connected.

As shown in FIG. 6(B), the four male connection portions 531 of the heater electrode terminals 53 are respectively inserted into the four female connection portions 631 of the relay member 63 of the connection member 6. The four connection projections 612 of the connector portion 61 of the connection member 6 are respectively inserted into the four connection recesses 632 of the relay member 63 of the connection member 6. The other basic configuration is the same as in embodiment 1.

Next, operation and effect of the present embodiment will be described.

In the present embodiment, the heater electrode terminals 53 and the connector portion 61 of the connection member 6 are connected via the relay member 63. Therefore, even if the configuration (for example, the pin shape, diameter, length, and pitch of the male connection portions 531, etc.) of the heater electrode terminals 53 is changed, electric connection between the heater electrode terminals 53 and the connection member 6 can be easily performed by changing the configuration (for example, the shape of the female connection portion 631, etc.) of the relay member 63 of the connection member 6, without changing the configurations of the other parts (for example, the connector portion 61, the connection cable 62, etc.) of the connection member 6. The other basic operation and effect are the same as in embodiment 1.

C. Other Embodiments

The present invention is not limited to the above embodiments or the like at all, and needless to say, can be carried out in various modes without deviating from the scope of the present invention.

(1) In the above embodiments, the body substrate has two heating regions (first heating region and second heating region), but the body substrate may have three or more heating regions. Although the number of the heater electrodes is two, three or more heater electrodes may be provided. Although the number of the heater electrode terminals is four, the number of the heater electrode terminals is not limited thereto.

(2) In the above embodiments, the internal through hole is located in the first heating region of the body substrate, but for example, the internal through hole may be located in the second heating region of the body substrate.

(3) In the above embodiments, the heater electrode terminals are provided in the internal through hole, and the attraction electrode terminal is provided in the terminal through hole. However, for example, the heater electrode terminals and the attraction electrode terminal may be provided in the internal through hole, without providing the terminal through hole.

(4) In the above embodiments, the internal through hole and the terminal through hole are both located in the first heating region of the body substrate, but for example, only one of the internal through hole and the terminal through hole may be located in the first heating region of the body substrate.

(5) In the above embodiments, four heater electrode terminals and one connection member are provided. However, without limitation thereto, it is only necessary that a plurality of heater electrode terminals are electrically connected to one connection member. For example, in one internal through hole, a plurality of heater electrode terminals and first corresponding connection member, and a plurality of other heater electrode terminals and second corresponding connection member, may be provided. In this case, the first connection member has a plurality of connection portions to be respectively connected to the plurality of heater electrode terminals, and the second connection member has a plurality of connection portions to be respectively connected to the plurality of other heater electrode terminals. Alternatively, in one internal through hole, a plurality of heater electrode terminals and one corresponding connection member, and another heater electrode terminal and an external terminal to be electrically connected to the other heater electrode terminal, may be provided.

DESCRIPTION OF REFERENCE NUMERALS

1: electrostatic chuck
11: body substrate
111: substrate front surface
112: substrate rear surface 12: metal base
121: base front surface
122: base rear surface
21: attraction electrode
51: internal through hole
113: heating region
41: heater electrode
53: heater electrode terminal
6: connection member

What is claimed is:

1. An electrostatic chuck comprising:
    a body substrate having a substrate front surface and a substrate rear surface and made of ceramic, the body substrate including a plurality of heating regions;
    a plurality of heater electrodes with a heater electrode provided in each of the plurality of heating regions of the body substrate;
    an attraction electrode provided in the body substrate;
    a metal base having a base front surface and a base rear surface and placed such that the base front surface faces the substrate rear surface of the body substrate, the metal base defining a single internal through hole extending from the base rear surface to the base front surface so as to penetrate the base front surface and the base rear surface of the metal base, the metal base further defining a terminal through hole extending from the base rear surface to the base front surface so as to penetrate the base front surface and the base rear surface;
    a plurality of heater electrode terminals provided in the single internal through hole of the metal base, each of the plurality of heater electrode terminals electrically connected to one of the plurality of heater electrodes; and
    a connection member provided in the single internal through hole, the connection member electrically connected to each of the plurality of heater electrode terminals;
    wherein the plurality of heating regions of the base body include a first heating region and a second heating region, and
    wherein, as seen from the substrate front surface of the body substrate toward the substrate rear surface of the body substrate, the single internal through hole is located in one of the plurality of heating regions of the body substrate, and only one of the single internal through hole and the terminal through hole is located in the first heating region of the body substrate.

2. An electrostatic chuck according to claim 1, wherein
    each of the plurality of heater electrode terminals has a male connection portion having a projecting shape, and
    the connection member has a plurality of female connection portions having a recess shape, with each of the female connection portions configured to connect to the male connection portion of each of the plurality of heater electrode terminals.

* * * * *